United States Patent
Oh et al.

(10) Patent No.: US 8,138,610 B2
(45) Date of Patent: Mar. 20, 2012

(54) MULTI-CHIP PACKAGE WITH INTERCONNECTED STACKED CHIPS

(75) Inventors: Jong Hoon Oh, Chapel Hill, NC (US); Klaus Hummler, Apex, NC (US); Oliver Kiehl, Charlotte, VT (US); Josef Schnell, Charlotte, VT (US); Wayne Frederick Ellis, Jericho, VT (US); Jung Pil Kim, Cary, NC (US); Lee Ward Collins, Cary, NC (US); Octavian Beldiman, South Burlington, VT (US)

(73) Assignee: Qimonda AG, Munich (DE)

( * ) Notice: Subject to any disclaimer, the term of this patent is extended or adjusted under 35 U.S.C. 154(b) by 386 days.

(21) Appl. No.: 12/028,542

(22) Filed: Feb. 8, 2008

(65) Prior Publication Data

US 2009/0200652 A1    Aug. 13, 2009

(51) Int. Cl.
*H01L 23/48* (2006.01)
(52) U.S. Cl. ......... 257/777; 257/723
(58) Field of Classification Search ......... 257/777, 257/723
See application file for complete search history.

(56) References Cited

U.S. PATENT DOCUMENTS

| | | | |
|---|---|---|---|
| 5,614,766 A * | 3/1997 | Takasu et al. | 257/777 |
| 6,448,661 B1 * | 9/2002 | Kim et al. | 257/777 |
| 6,611,052 B2 * | 8/2003 | Poo et al. | 257/686 |
| 6,614,104 B2 * | 9/2003 | Farnworth et al. | 257/686 |
| 7,211,900 B2 * | 5/2007 | Shin et al | 257/777 |
| 7,282,804 B2 * | 10/2007 | Lee | 257/777 |
| 7,335,994 B2 * | 2/2008 | Klein et al. | 257/778 |
| 7,462,925 B2 * | 12/2008 | Tsai et al. | 257/676 |
| 7,598,617 B2 * | 10/2009 | Lee et al. | 257/777 |
| 2002/0074637 A1 * | 6/2002 | McFarland | 257/686 |
| 2007/0215992 A1 * | 9/2007 | Shen et al. | 257/668 |
| 2008/0105984 A1 * | 5/2008 | Lee | 257/777 |

* cited by examiner

*Primary Examiner* — Eugene Lee
(74) *Attorney, Agent, or Firm* — Patterson & Sheridan, LLP

(57) ABSTRACT

A multi-chip package is provided that has at least a first, second and third chip, each comprising a top and bottom surface. The multi-chip package also has a package substrate for interfacing with a printed circuit board (PCB). The chips and the package substrate are housed within an encapsulation material. The bottom surface of the first chip is attached to the package substrate. The top surface of the first chip has a first plurality of landing pads, which serve as a mechanical and electrical interface between the first and second chip. The bottom surface of the second chip has a second plurality of landing pads that serve as a mechanical and electrical interface between the second and first chip. Additionally, the top surface of the second chip has a third plurality of landing pads that serve as a mechanical and electrical interface between the second and third chip.

20 Claims, 10 Drawing Sheets

MULTI-CHIP PACKAGE WITH INTERCONNECTED STACKED CHIPS

BACKGROUND OF THE INVENTION

Multi-chip packages (MCPS) are individual semiconductor packages, made of plastic or ceramic, containing two or more chips typically connected internally with wire-bonding. MCPs allow multiple chips to be integrated into a single, more compact, package with the same footprint on a printed circuit board (PCB) as a single chip. MCPs typically contact the PCB with pins, such as solder balls or other type of conductive elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
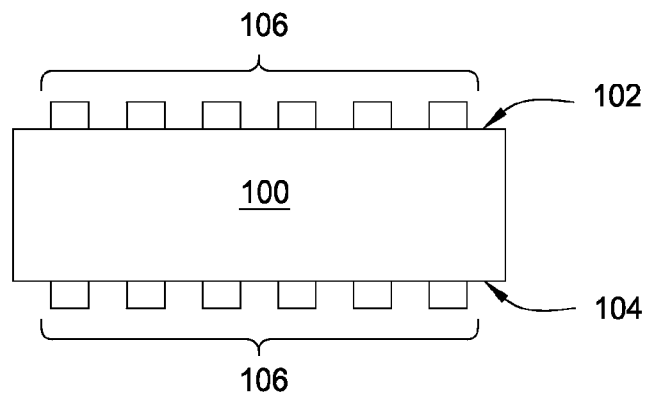
FIG. 1 illustrates an integrated circuit according to an embodiment of the present invention.

Techniques presented herein allow flexible stacking of integrated circuits in a multi-chip package (MCP), wherein an integrated circuit may be a single die, a pre-assembled package, or an MCP. Each integrated circuit may have a plurality of landing pads on a top and/or bottom surface. The plurality of landing pads may be solder-bumped, therefore providing a mechanical and electrical interface to other integrated circuits.

Embodiments of the invention generally provide techniques that allow flexible stacking of chips in a multi-chip package (MCP). For example, by solder-bumping a top and/or bottom surface of a chip, multiple chips may be attached to each other, mechanically and electrically, within a multi-chip package.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with, or include, any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In either case, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including other memory devices, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (FeRAM), phase-change RAM (PRAM), electrically erasable programmable read-only memory (EEPROM), laser programmable fuses, electrically programmable fuses (e-fuses) and any other types of nonvolatile memory.

Stacking Integrated Circuits in an MCP

Embodiments of the invention generally provide techniques that allow flexible stacking of chips in a multi-chip package (MCP). For example, by solder-bumping a top and/ or bottom surface of a chip, multiple chips may be attached to each other, mechanically and electrically, within a multi-chip package.

FIG. 1 is a block diagram illustrating a single chip 100 according to one embodiment. The single chip 100 has a top surface 102 and a bottom surface 104. Additionally, the single chip 100 may also have a plurality of landing pads 106 (e.g., metal contacts). The plurality of landing pads 106 may be used to interface with other chips, which also have a plurality of landing pads (as described below in reference to FIG. 2).

As illustrated, each of the plurality of landing pads 106 can be placed on the top surface 102 and/or the bottom surface 104 of the single chip 100. The capability to place landing pads 106 on either surface of the single chip 100 provides flexibility when stacking a plurality of chips. For example, the placement of landing pads 106 on the bottom surface 104 of the single chip 100 enables the capability to stack the single chip 100 on top of another chip. Alternatively, the placement of landing pads 106 on the top surface 102 of the single chip 100 enables the capability to stack another chip on top of the single chip 100. Stacking chips in this manner enables any number of chips to be stacked on top of each other. Furthermore, once stacked, the plurality of stacked chips may be used to form a multi-chip package.

Figure 2A:
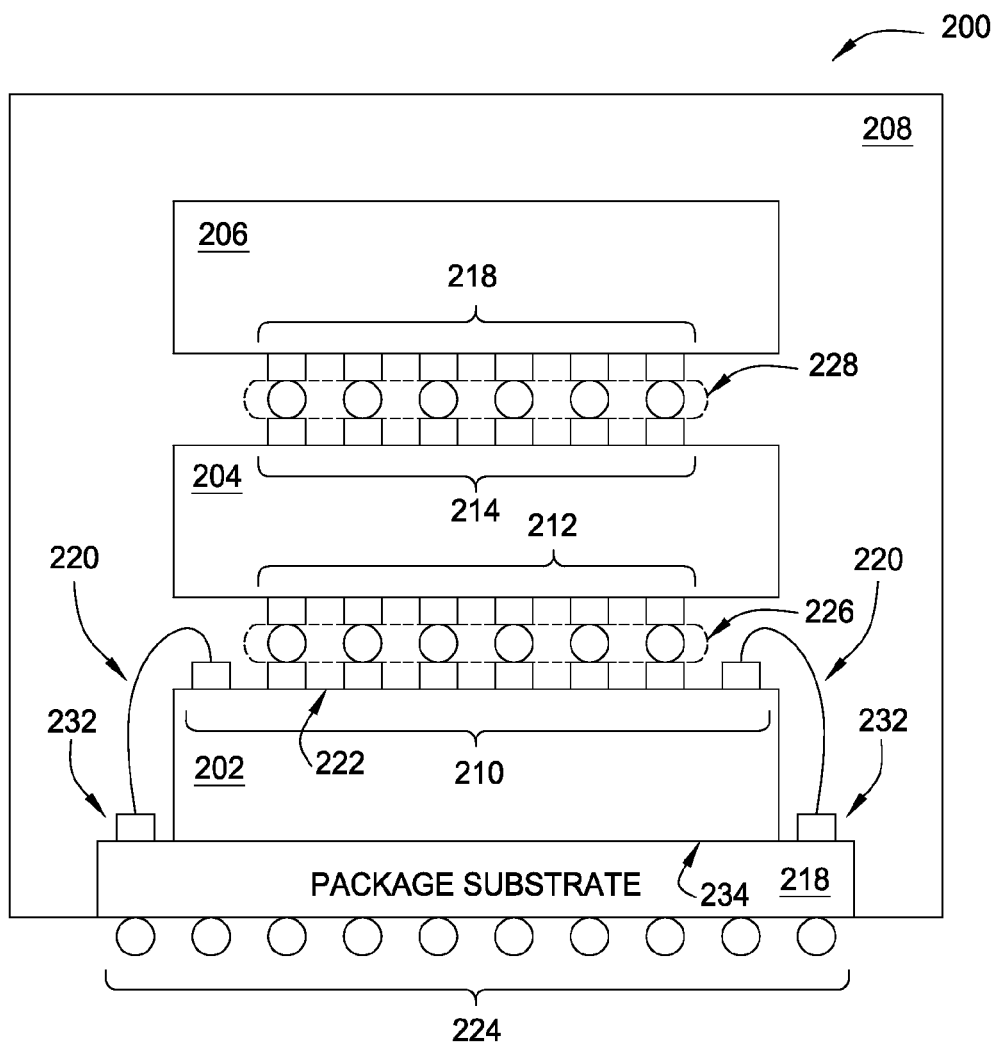
FIG. 2A illustrates a multi-chip package (MCP) according to an embodiment of the present invention.

FIG. 2A is a block diagram of an embodiment of a multi-chip package (MCP) 200 including a plurality of chips 202, 204, 206 (as described above with reference to FIG. 1). The plurality of chips 202, 204, 206 may be housed within an encapsulation material 208, for example ceramic or plastic. Each of the plurality of chips 202, 204, 206 may have a plurality of landing pads 210, 212, 214, 216 on a surface facing away or facing towards a package substrate 218. The landing pads 210, 212, 214, 216 of the chips 202, 204, 206 may be electrically connected (e.g., via bond wires 220, typically made of gold or aluminum) to an upper surface 222 of the package substrate 218. Alternatively, the landing pads 210, 212, 214, 216 of the chips 202, 204, 206 may be electrically and mechanically connected (via solder balls 224, 226, 228 or some other type of external lead) to landing pads 210, 212, 214, 216 of the package substrate 218 or other chips. Solder balls 224 may also be connected to a lower surface 230 of the package substrate 218 to provide an external connection, for example, to a printed-circuit board (PCB) (not illustrated).

In general, the MCP 200 may include at least two chips. In the representative illustration, the MCP 200 includes three chips; a first chip 202, a second chip 204, and a third chip 206. For illustrative purposes, only three chips are shown. However, the number of chips may change according to the needs of a particular application.

Each of the chips 202, 204, 206 may be connected electrically and/or mechanically with either another chip or the package substrate 218 within the MCP 200. For example, the first chip 202 may be physically bonded to the package substrate 218 by an adhesive material (not illustrated). To provide an electrical connection to the package substrate 218, landing pads 210 of the first chip 202 may be electrically connected (e.g., via bond wires 220) to a plurality of landing pads 232 on an upper surface 234 of a package substrate 218.

Figure 2B:
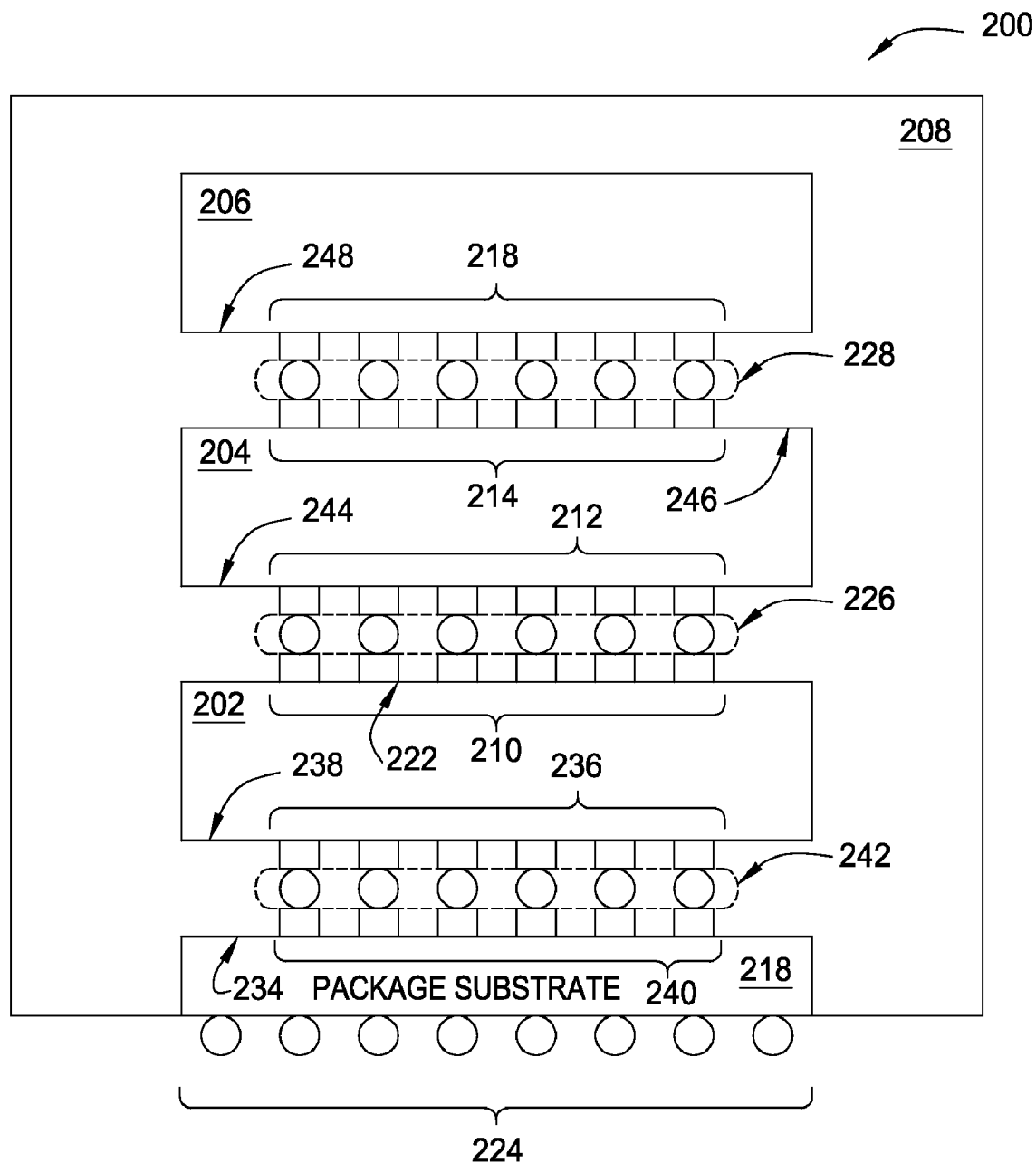
FIG. 2B illustrates a multi-chip package according to another embodiment of the present invention.

In one embodiment, as illustrated in FIG. 2B, the package substrate 218 and the first chip 202 may be mechanically and electrically attached by solder-bumping (i.e., forming a plurality of solder bumps) a plurality of landing pads 236 on the first chip 202. In this case, the bottom surface 238 of the first chip 202 and the upper surface 234 of the package substrate 218 may both have a plurality of landing pads 236, 240. Here, the bottom surface 238 of the first chip 202 may be solder-bumped. Subsequently, the solder-bumped landing pads 236 of the first chip 202 may be placed in contact with the plurality of landing pads 240 of the package substrate 218. Thereafter, the solder bumps 242 may be reflowed, thus forming an electrical and mechanical interconnection between the first chip 202 and the package substrate 218. In another embodiment, the plurality of landing pads 240 on the upper surface 234 of the package substrate 218 may be solder-bumped instead of the plurality of landing pads 236 on the bottom surface 238 of the first chip 202.

In addition to having a plurality of landing pads 236 on the bottom surface 238, the first chip 202 may also have a plurality of landing pads 210 on the top surface 222. This may provide an electrical and mechanical connection to the second chip 204. In this case, the second chip 204 may have a plurality of landing pads 212 on its bottom surface 244, thereby allowing the second chip 204 to interface with the first chip 202.

Moreover, the second chip 204 may also a plurality of landing pads 214 on its top surface 246. This may provide an electrical and mechanical connection to the third chip 206. In this case, the third chip 206 may have a plurality of landing pads 218 on its bottom surface 248, thereby allowing the third chip 206 to interface with the second chip 204.

The solder-bumping technique used to attach the package substrate 218 with the first chip 202 (described above) may also be used to attach the first chip 202 with the second chip 204, and also the second chip 204 with the third chip 206. For example, when attaching the second chip 204 to the first chip 202, the plurality of landing pads 212 on the bottom surface 244 of the second chip 204 may be solder-bumped, and subsequently placed in contact with the plurality of landing pads 210 on the top surface 222 of the first chip 202. Thereafter, the solder bumps 226 may be reflowed to form an electrical and mechanical interconnection between the first chip 202 and the second chip 204. In one embodiment, the plurality of landing pads 210 on the top surface 222 of the first chip 202 may be solder-bumped.

When attaching the third chip 206 to the second chip 204, the plurality of landing pads 218 on the bottom surface 248 of the third chip 206 may be solder-bumped, and subsequently placed in contact with the plurality of landing pads 214 on the top surface 246 of the second chip 204. Thereafter, the solder bumps 228 may be reflowed to form an electrical and mechanical interconnection between the second chip 204 and the third chip 206. In one embodiment, the plurality of landing pads 214 on the top surface 246 of the second chip 204 may be solder-bumped.

In one embodiment, the first, second, and third chip 202, 204, 206 may be solder-bumped simultaneously or in independent stages. Additionally, in another embodiment, the solder bumps of the first, second, and/or third chip 202, 204, 206, may be reflowed simultaneously or in independent stages.

Using the solder-bumping technique to interconnect the plurality of chips also provides flexibility for stacking different types of chips in an MCP. For example, each chip in an MCP may be a single die, a pre-assembled package (e.g., one or more dies packaged within an encapsulation material, such as plastic or ceramic), an MCP or any other type of chip known in the art that is capable of being solder-bumped. Moreover, the MCP may include any combination of these chips. This may provide the benefit to manufacture custom MCP's that are specific to a particular need.

Figure 3:
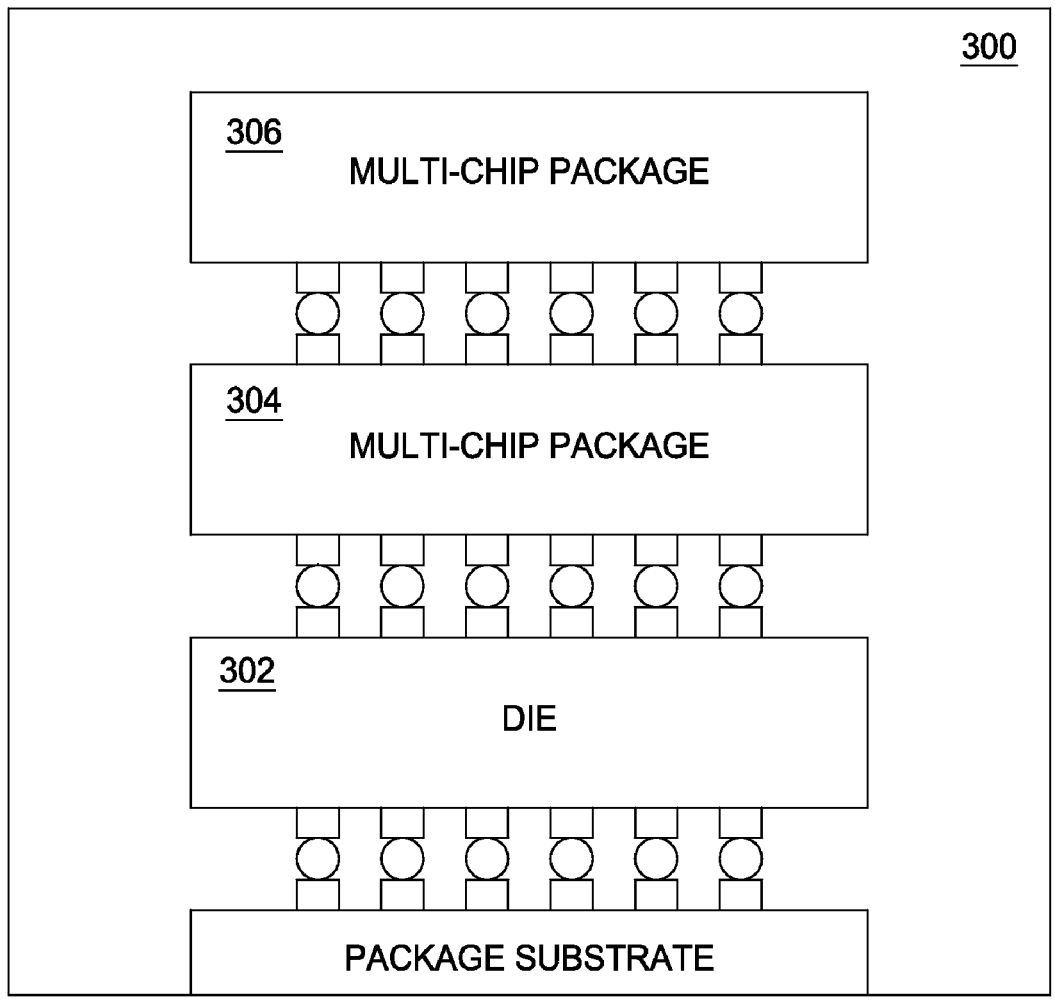
FIG. 3 illustrates a multi-chip package according to another embodiment of the present invention.

For example, FIG. 3 illustrates an MCP 300 including a die 302, a first MPC 304, and a further MCP 306 according to one embodiment. Each chip may also be a variety of different integrated circuits (processor, non-volatile memory, volatile memory, etc.) known in the art. This may provide further flexibility to configure the MCP 300 in any number of different ways.

Figure 4A:
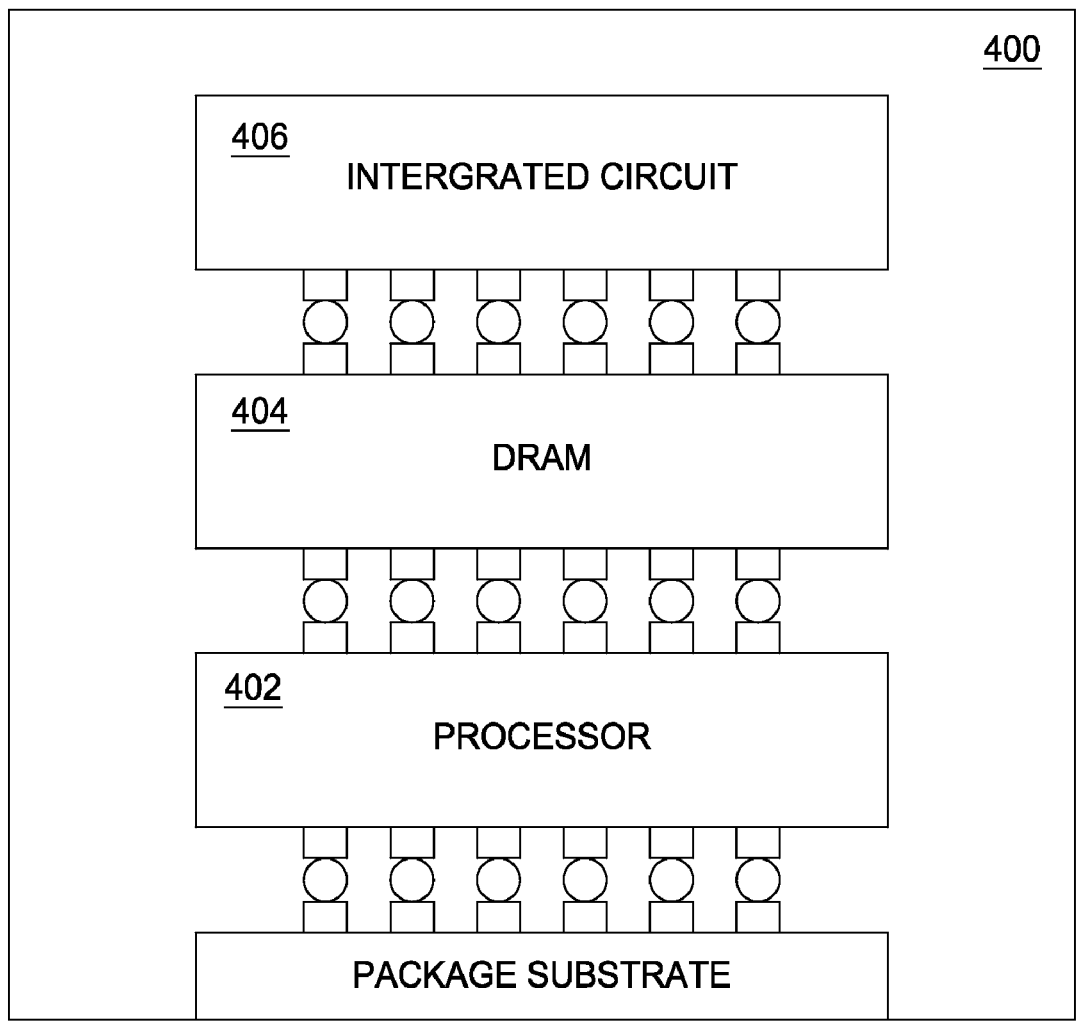
FIGS. 4A-4F illustrate multi-chip packages according to embodiments of the present invention.

For example, FIG. 4A illustrates an MCP 400 including a first chip 402 and a second chip 404 according to one embodiment. The first chip 402 may be a processor, and the second chip 404 may be a DRAM. Additionally, the MCP 404 may include a third chip 406. The third chip 406 may be a variety of different integrated circuits depending on the configuration needed for the MCP 400.

Figure 4B:
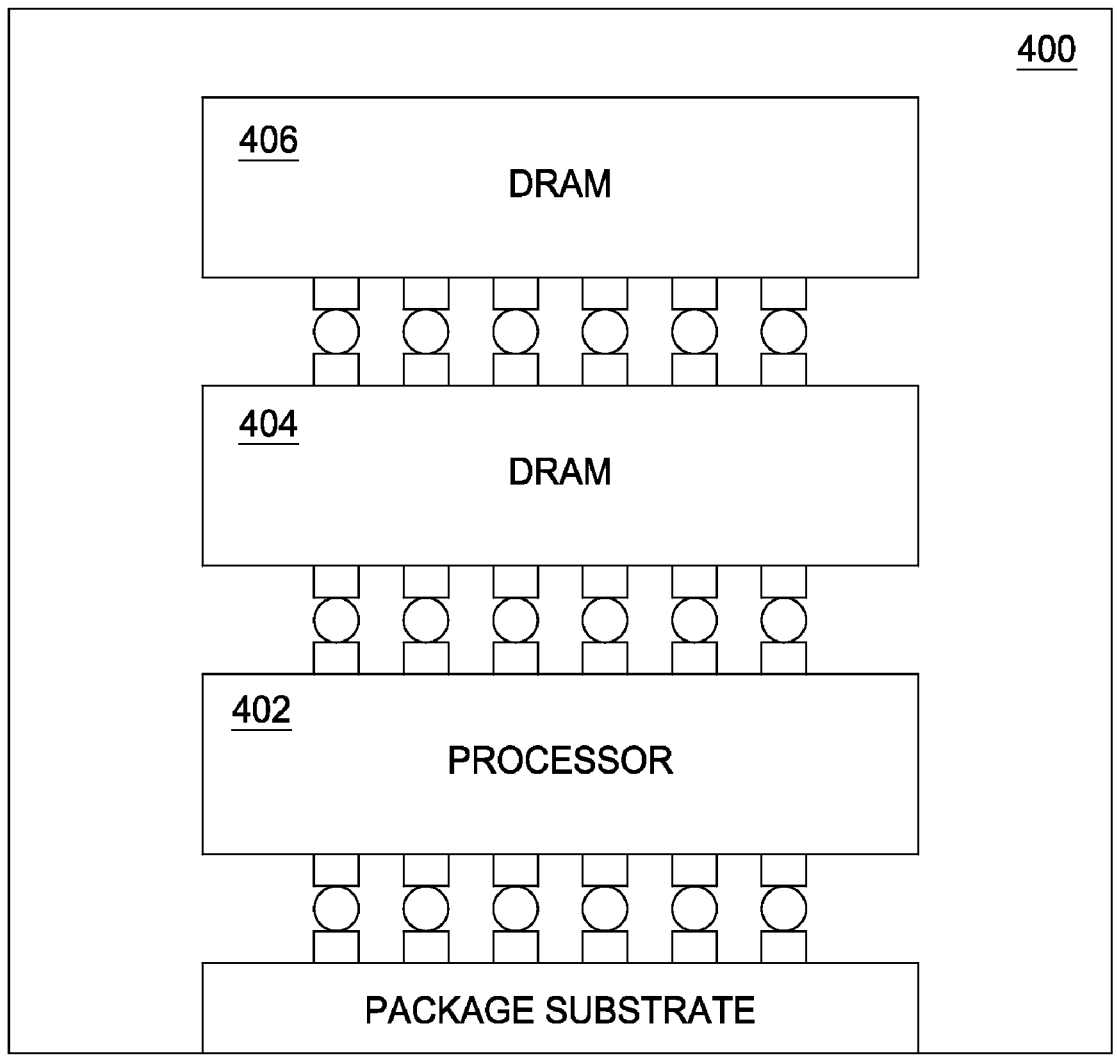
Figure 4C:
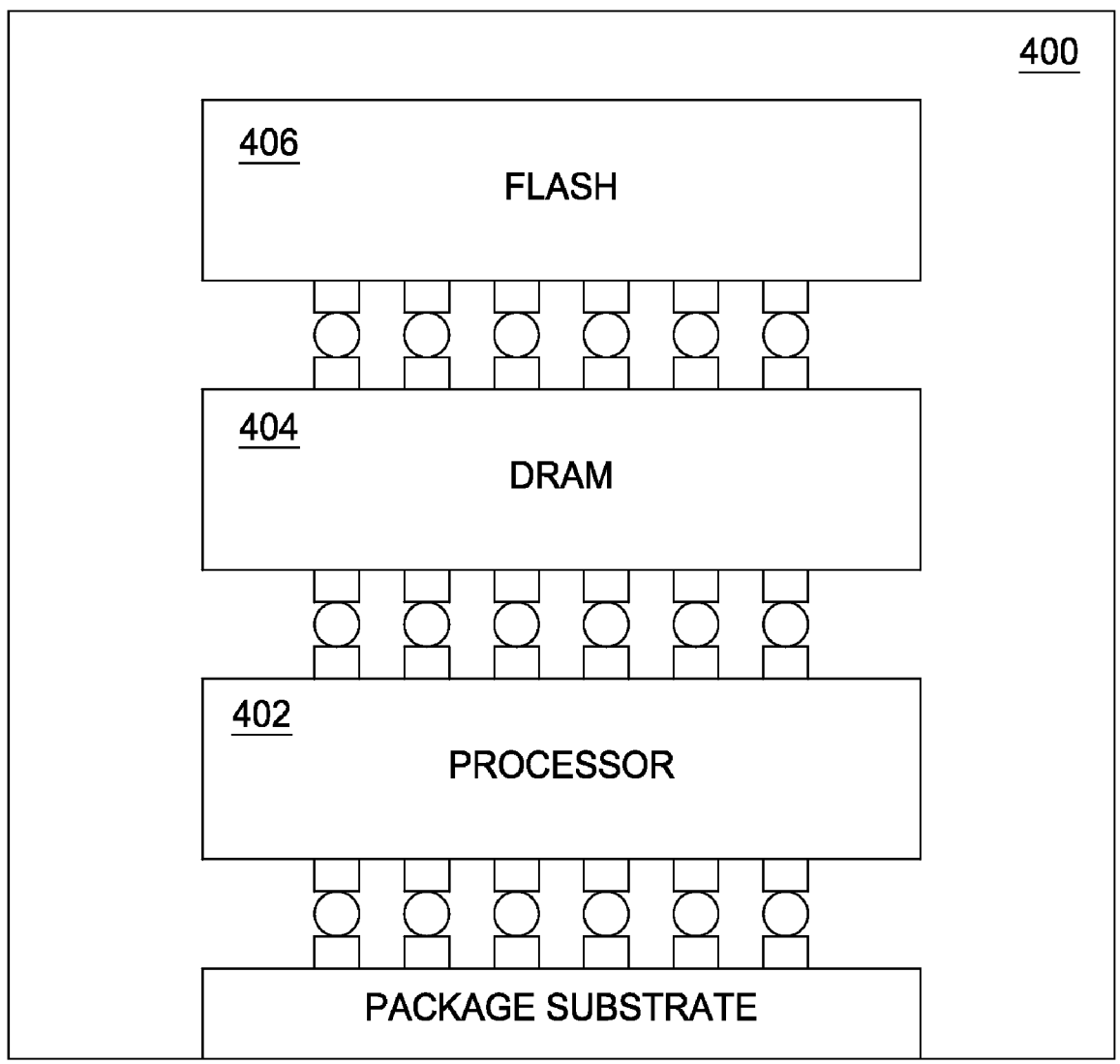
Figure 4D:
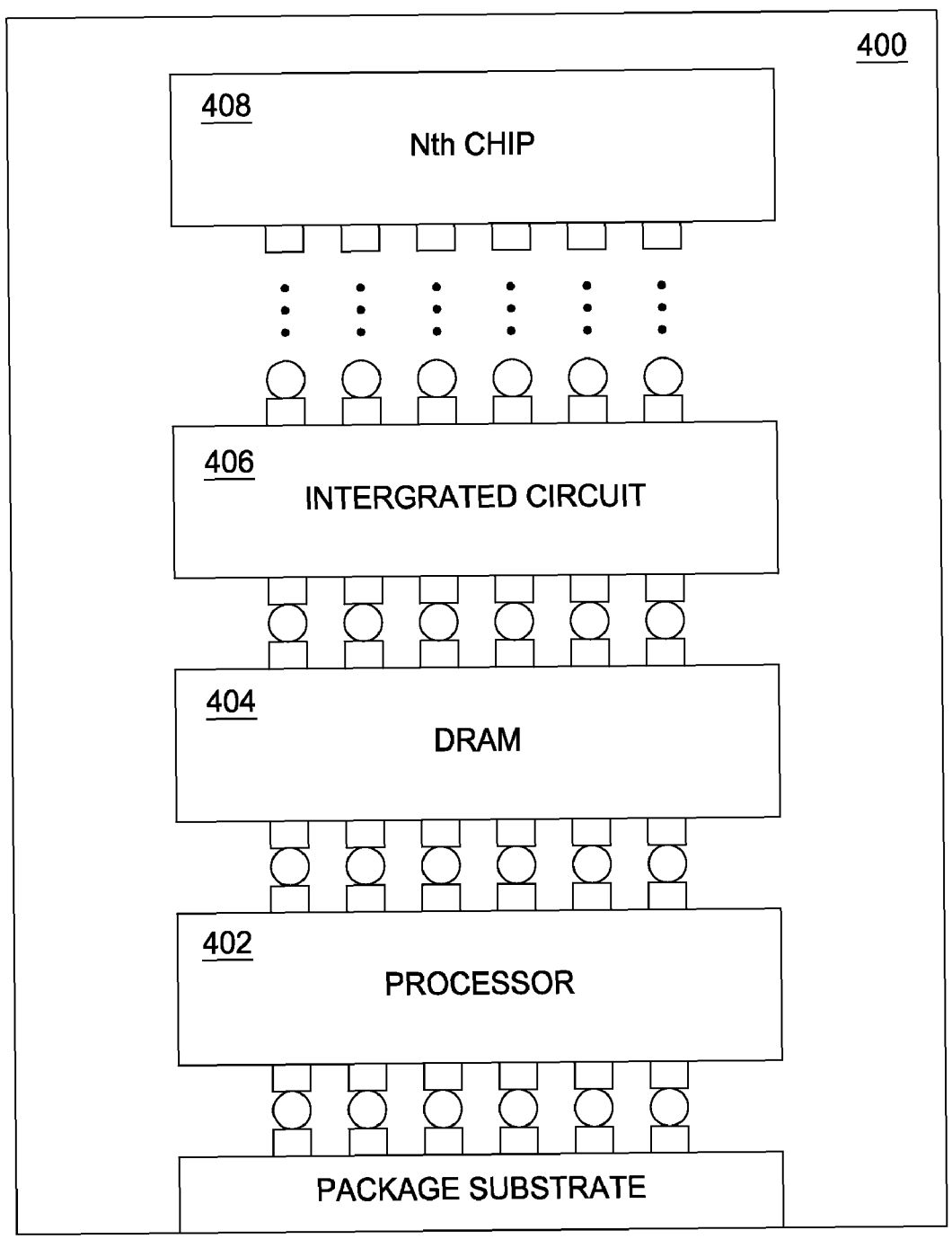

In one embodiment, as illustrated in FIG. 4B, if additional DRAM is required for the MCP 400, the third chip 406 may be another DRAM chip. In another embodiment, as illustrated in FIG. 4C, if a different type of memory is required, for example a non-volatile memory, the third chip 406 may be a FLASH memory. Furthermore, in yet another embodiment, as illustrated in 4D, the MCP 400 may have an additional N number chips 408 attached to the third chip 406 to further change the configuration of the MCP 400.

Attaching additional chips may also provide the capability to alter the functionality of an existing chip in the MCP 400. For example, upon attachment of an additional chip 408, the additional chip 400 may activate a wider bus interface located in a memory chip 404 in the MCP 400. In one embodiment, the additional chip 400, upon attachment, may automatically send a control signal to the memory chip 404 to activate the new functionality.

Figure 4E:
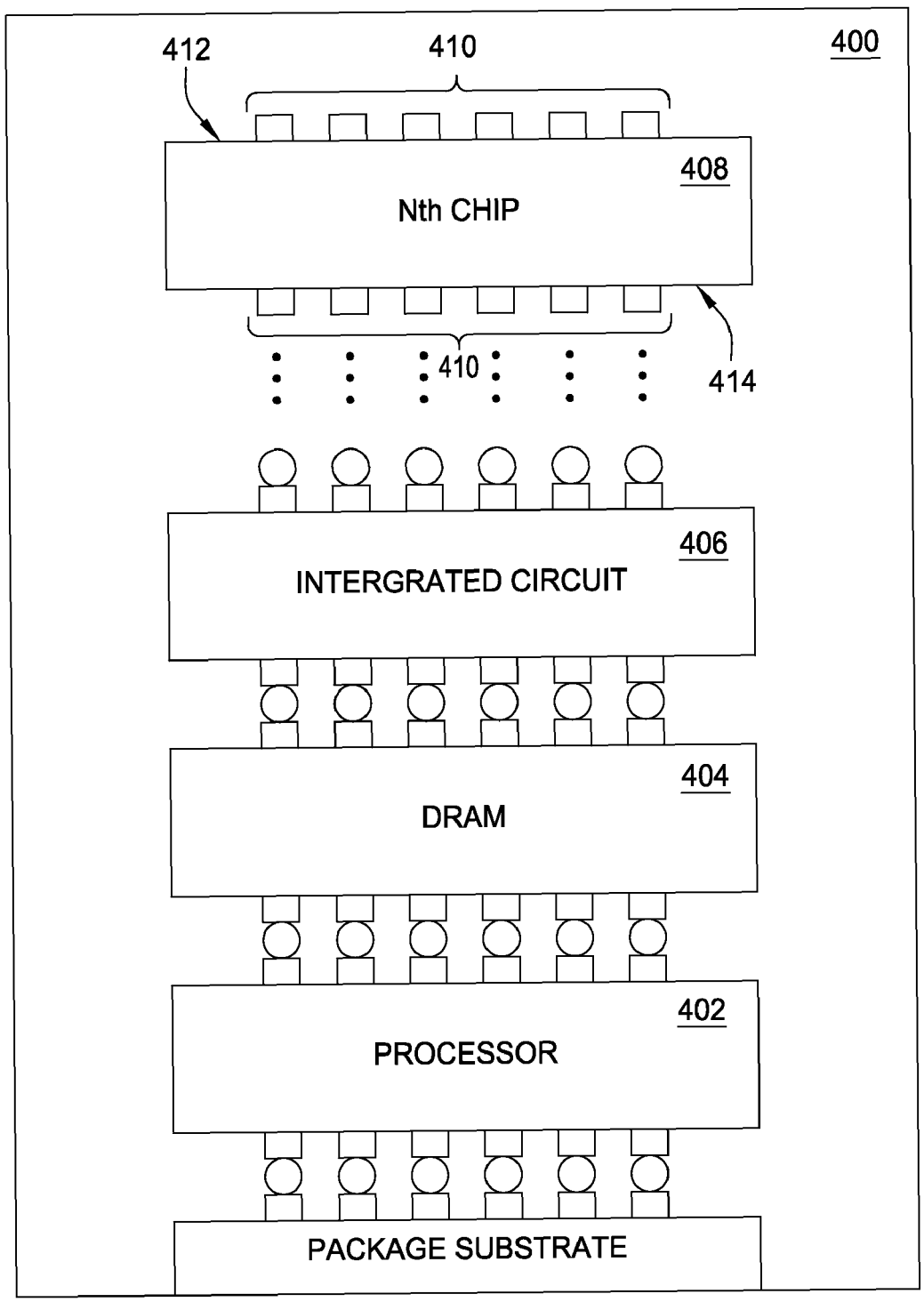
Figure 4F:
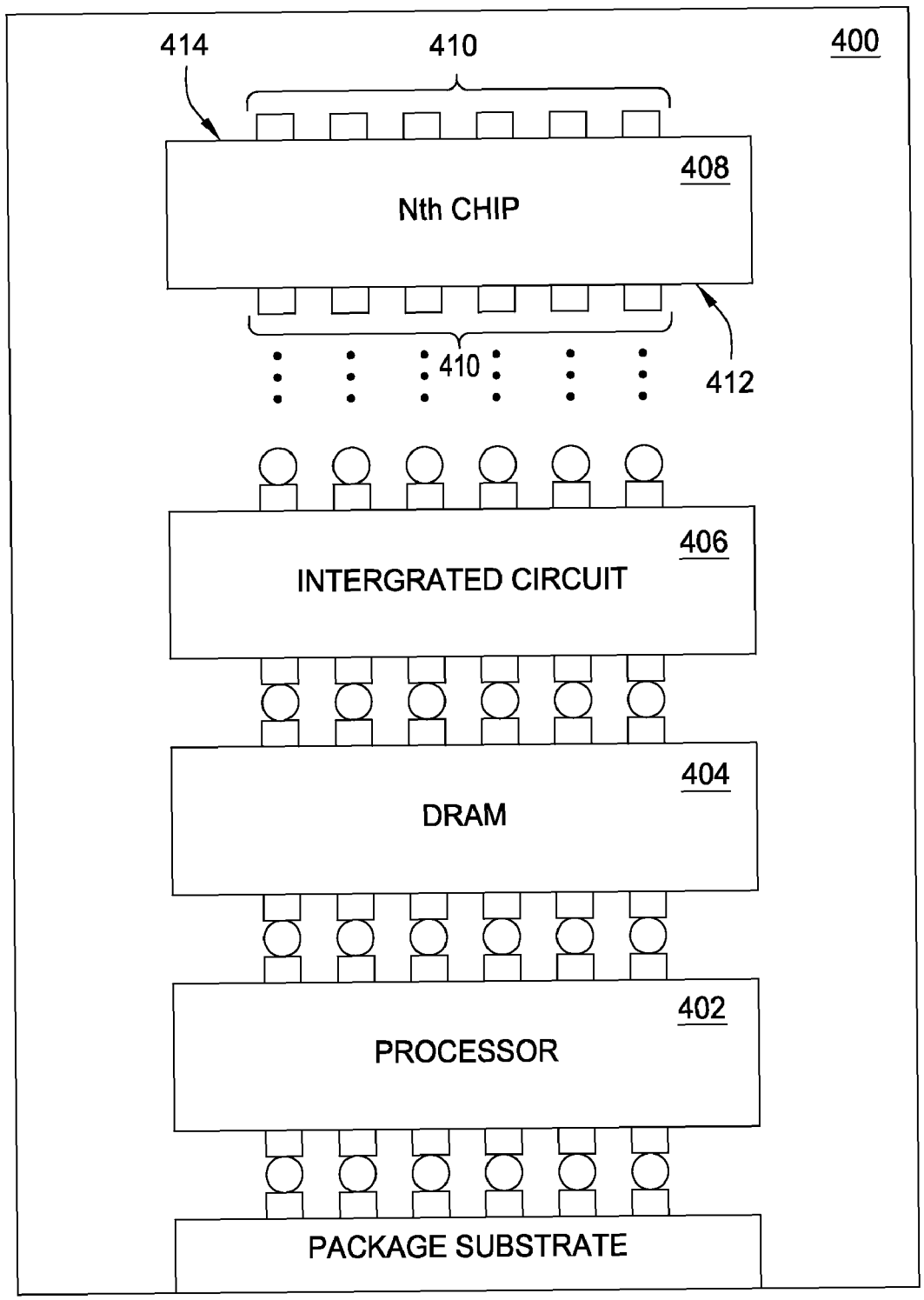

Furthermore, the functionality that is changed via the additional chip 400 may differ depending on the orientation of the additional chip 400. For example, the functionality may be changed depending on which surface (top or bottom) of the additional chip 400 is attached to an existing chip in the MCP 400. In this case, as illustrated in FIGS. 4E and 4F, a plurality of landing pads 410 may be located on both the top surface 412 and the bottom surface 414 of the additional chip 408.

The plurality of landing pads 410 located on the bottom surface 414 of the additional chip 408 may be connected to a first internal circuitry (not illustrated) of the additional chip 408. Conversely, the plurality of landing pads 410 located on the top surface 412 of the additional chip 408 may be connected to a second internal circuitry (not illustrated) of the additional chip 408. Once the additional chip 408 is attached, the first or second circuitry (depending on the orientation of the additional chip 408) may send a respective control signal, indicative of a functionality change to a chip, for example the memory chip 404. Each control signal may indicate a different functionality change to the memory chip 404.

An assortment of functionality may be changeable within the MCP 400. Some of the functionality may include, but is not limited to, the bus width of the memory chip 404, the amount of accessible of memory within the memory chip 404, and enabling or disabling error logic, such Error Correction Code (ECC) within the memory chip 404.

For example, in an embodiment where the additional chip 408 changes a bus width of a memory chip 404, attaching the bottom surface 414 of the additional chip 408 to an existing chip in the MCP 400 may activate a first bus width of a memory chip 404 in the MCP 400. In this case, upon attachment, the first internal circuitry may automatically send a control signal to the memory chip 404. Here, the control signal may notify the memory chip 404 to enable the first bus width of the memory chip 404. Alternatively, attaching the top surface 412 of the additional chip 408 to an existing chip in the MCP 400 may activate a second bus width of a memory chip 404 in the MCP 400. In this case, upon attachment, the second internal circuitry may automatically send a control signal to the memory chip 404. Here, the control signal may notify the memory chip 404 to enable the second bus width of the memory chip 404.

The first and second bus width may be of any width. For example, in one embodiment, the first bus width may be x16, and the second bus width may be x32.

Figure 5A:
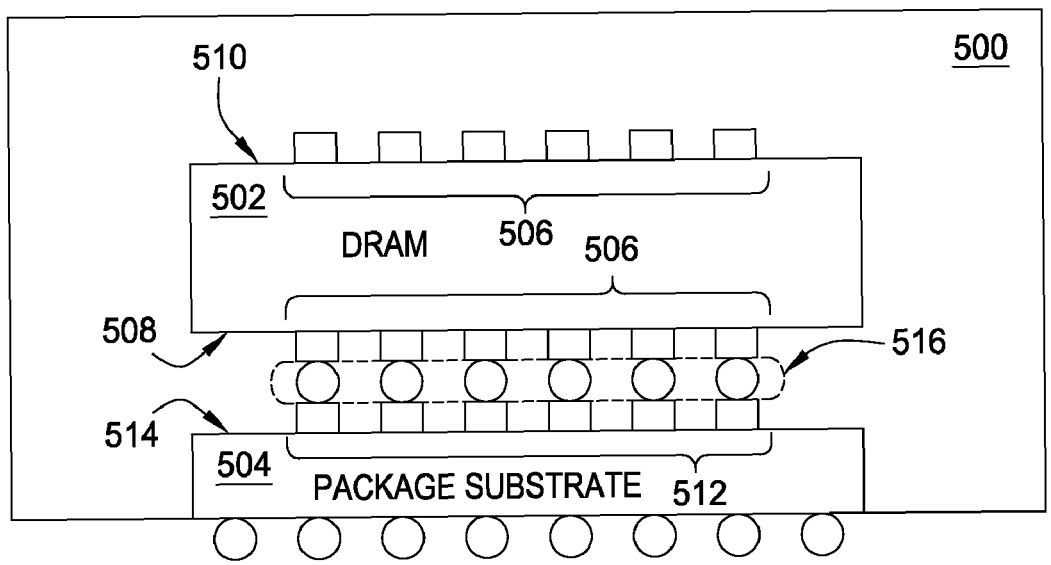
FIGS. 5A-5B illustrate a single die package according to embodiments of the present invention.

In another embodiment, the functionality within a single chip (without the use of an additional chip) may be changed depending on the orientation of the single chip. As an example, FIG. 5A illustrates a single chip package 500 housing a single chip 502 and a package substrate 504. As discussed above (with reference to FIG. 1), a plurality of landing pads 506 may be located on the top and bottom surface 508, 510 of the single chip 502. The plurality of landing pads 506 located on the bottom surface 510 of the single chip 502 may be attached to a plurality of landing pads 512 on an upper surface 514 of the package substrate 504 (for example, via solder balls 516).

Figure 5B:
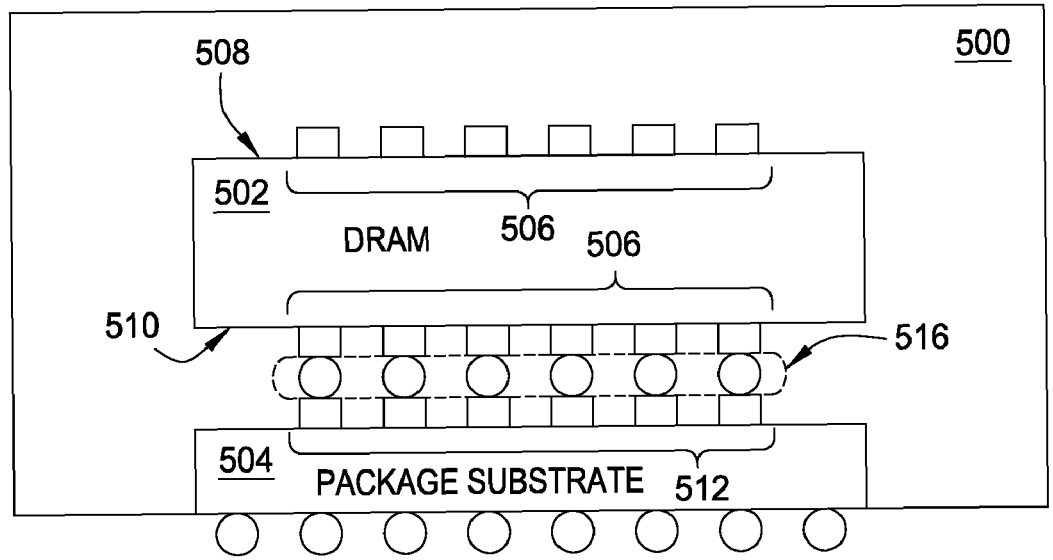

As discussed above, the single chip 502 may be a variety of different integrated circuits. In one embodiment, as illustrated in FIGS. 5A and 5B, the single chip 502 may be a DRAM. The DRAM 502 may have functionality that changes depending on the orientation of the DRAM 502. In one embodiment, the functionality may change depending on which surface (top or bottom 508, 510) of the DRAM 502 is attached to the package substrate 504 (or another chip if placed within an MCP).

Similar to an MCP (as discussed above with reference to FIGS. 4E and 4F) an assortment of functionality may be changeable within a single chip 502. Some of the functionality may include, but is not limited to, the bus width of the DRAM 502, the amount of accessible of memory within the DRAM 502, and enabling or disabling error logic, such Error Correction Code (ECC) within the DRAM 502.

FIGS. 5A and 5B illustrate a DRAM 502, housed within a single die package that supports multiple bus widths. As stated earlier, depending on the surface attached to the package substrate 504, the bus width of the DRAM 502 may vary. In this case, the plurality of landing pads 506 on the bottom surface 508 may be connected to internal circuitry (not illustrated) of the DRAM 502 that utilizes logic for a first bus width. Conversely, the plurality of landing pads 506 on the top surface 510 of the DRAM 502 may be connected to internal circuitry (not illustrated) of the DRAM 502 that utilizes logic for a second bus width.

Accordingly, as illustrated FIG. 5A, the bottom surface 508 of the DRAM 502 may be attached to the package substrate 504. The DRAM oriented in this manner may utilize the first bus width of the DRAM 502. Alternatively, as illustrated in FIG. 5B, the top surface 510 of the DRAM 502 may be attached to the package substrate 504. The DRAM 502 oriented in this manner may utilize the second bus width of the DRAM 502. The first and second bus width may be of any width. For example, in one embodiment, the first bus width may be x16, and the second bus width may be x32.

As discussed above, providing a technique of flexible stacking of an MCP may provide the capability of stacking a variety of different chips and integrated circuits within an MCP. By solder-bumping a top and/or bottom surface of a chip or integrated circuit, multiple chips can be attached to each other mechanically and electrically. Furthermore, providing this level of flexibility allows the capability to change the configuration of an MCP, the functionality of any of the chips within the MCP, or the functionality of a single chip within a single chip package.

While the foregoing is directed to embodiments of the present invention, other and further embodiments of the invention may be devised without departing from the basic scope thereof, and the scope thereof is determined by the claims that follow.

What is claimed is:

1. A multi-chip package (MCP) comprising a plurality of devices arranged in a stack, comprising:
   a package substrate defining a printed circuit board (PCB) interfacing surface for interfacing with a PCB and a device interfacing surface opposite the PCB interfacing surface;
   a first device of the plurality of devices attached to the device interfacing surface, the first device having a plurality of landing pads on a top surface of the first device;
   a second device of the plurality of devices attached to the first device via electrical connections between a plurality of landing pads on a bottom surface of the second device and the plurality of landing pads on the top surface of the first device;
   a third device of the plurality of devices attached to the second device via electrical connections between a plurality of landing pads on a bottom surface of the third device and the plurality of landing pads on the top surface of the second device; and
   an encapsulation material encapsulating the first, second, and third devices,
   wherein one of the attached devices that is farther from the package substrate in the stack than a different attached device transmits a control signal to the different attached device that changes a functionality of the different attached device relative to the functionality of the different attached device when the one of the attached devices is not attached within the MCP.

2. The MCP of claim 1, wherein at least one of the three devices is a pre-assembled package, wherein the pre-assembled package is at least one die housed within an encapsulation material.

3. The MCP of claim 1, wherein the plurality of landing pads on the top surface of the first device are attached to the plurality of landing pads on the bottom surface of the second device using solder balls.

4. The MCP of claim 1, wherein the third device comprises, a plurality of landing pads on a top surface to serve as an interface between the third device and an additional device.

5. The MCP of claim 1, wherein the plurality of landing pads on the bottom surface of the third device are attached to a plurality of landing pads on the top surface of the second device using solder balls.

6. The MCP of claim 1, wherein at least one of the three devices is a processor.

7. The MCP of claim 1, wherein at least one of the three devices is a volatile memory.

8. The MCP of claim 1, further comprising at least a fourth device attached to the third device via electrical connections between a plurality of landing pads on a bottom surface of the fourth device and a plurality of landing pads on a top surface of the third device.

9. A system, comprising:
   a printed-circuit board (PCB); and
   a multi-chip package, comprising:
      a first package substrate defining a PCB interfacing surface for interfacing with the PCB and a device interfacing surface opposite the PCB interfacing surface;
      a plurality of multi-chip packages, wherein the plurality of multi-chip packages are stacked within the multi-chip package and contain a second package substrate attached to a plurality of landing pads on a first chip within each of the plurality of multi-chip packages and at least one of (i) the device interfacing surface of the first package substrate and (ii) a landing pad on a top surface of one of the plurality of multi-chip packages, and wherein the PCB interfacing surface is disposed on the PCB; and
      an encapsulation material encapsulating the plurality of multi-chip packages,
      wherein a second chip within one of the plurality of multi-chip packages that is farther from the second package substrate than a third chip within the stack of the one of the plurality of multi-chip packages transmits a control signal to the third chip that changes a functionality of the third chip relative to the functionality of the third chip when the second chip is not included in the one of the plurality of multi-chip packages.

10. The system of claim 9, wherein at least one of the plurality of multi-chip packages comprises a processor.

11. The system of claim 9, wherein at least one of the plurality of multi-chip packages comprises a non-volatile memory.

12. The system of claim 9, wherein at least one of the plurality of multi-chip packages comprises a volatile memory.

13. The MCP of claim 1, wherein the different attached device is a volatile or non volatile memory device, and wherein the functionality of the different attached device is a bus that changes from a first bus width to a second bus width after receiving the control signal from the second device, wherein the second bus width is wider than the first bus width.

14. The MCP of claim 1, wherein the different attached device is a volatile memory device, and wherein the functionality of the different attached device is at least one of an amount of accessible memory in the volatile memory and error correction code.

15. The MCP of claim 14, wherein the control signal of the one of the attached devices enables or disables the error correction code.

16. The MCP of claim 1, wherein a second functionality of at least one of the first, second and third devices changes when the plurality of landing pads of a first surface of the at least one of the first, second and third devices is attached such that the first surface is closer to the substrate than a second surface containing a plurality of landing pads of the at least one of the first, second and third devices relative to when the plurality of landing pads of the second surface is attached such that the second surface is closer to the substrate than the first surface.

17. The system of claim 9, wherein the third chip is a volatile or non volatile memory device, and wherein the functionality of the third chip is a bus that changes from a first bus width to a second bus width after receiving the control signal from the second device, wherein the second bus width is wider than the first bus width.

18. The system of claim 9, wherein the third chip is a volatile memory device, and wherein the functionality of the third chip is at least one of an amount of accessible memory in the volatile memory device and error correction code.

19. The system of claim 9, wherein a second functionality of the third chip changes when a plurality of landing pads of a first surface of the third chip is attached such that the first surface is closer to the substrate than a second surface containing a plurality of landing pads of the third chip relative to when the plurality of landing pads of the second surface is attached such that the second surface is closer to the substrate than the first surface.

20. A multi-chip package (MCP) comprising:

a package substrate defining a printed circuit board (PCB) interfacing surface for interfacing with a PCB and a device interfacing surface opposite the PCB interfacing surface;

a first device attached to the device interfacing surface, the first device having a plurality of landing pads on a top surface of the first device;

a second device attached to the first device via electrical connections between a plurality of landing pads on a bottom surface of the second device and the plurality of landing pads on the top surface of the first device;

a third device attached to the second device via electrical connections between a plurality of landing pads on a bottom surface of the third device and the plurality of landing pads on the top surface of the second device; and an encapsulation material encapsulating the first, second, and third devices, wherein a functionality of at least one of the attached devices changes when a plurality of landing pads of a first surface of the at least one of the attached devices is attached in the MCP such that the first surface is closer to the package substrate than a second surface containing a plurality of landing pads of the at least one of the attached devices relative to when the plurality of landing pads of the second surface is attached in the MCP such that the second surface is closer to the package substrate than the first surface.

* * * * *